United States Patent
Takebayashi et al.

(10) Patent No.: US 11,784,068 B2
(45) Date of Patent: Oct. 10, 2023

(54) MEMBER FOR SEMICONDUCTOR MANUFACTURING APPARATUS AND METHOD FOR MANUFACTURING THE SAME

(71) Applicant: NGK INSULATORS, LTD., Nagoya (JP)

(72) Inventors: Hiroshi Takebayashi, Handa (JP); Joyo Ito, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 0 days.

(21) Appl. No.: 17/454,849

(22) Filed: Nov. 15, 2021

(65) Prior Publication Data

US 2022/0246451 A1 Aug. 4, 2022

(30) Foreign Application Priority Data

Feb. 4, 2021 (JP) .................................. 2021-016206

(51) Int. Cl.
*H01L 21/67* (2006.01)
*H01L 21/687* (2006.01)
(Continued)

(52) U.S. Cl.
CPC .... *H01L 21/67103* (2013.01); *H01L 21/6833* (2013.01); *H01L 21/68785* (2013.01); *H01J 37/32715* (2013.01)

(58) Field of Classification Search
CPC ......... H01J 37/32715; H01L 21/67103; H01L 21/6833; H01L 21/68785
See application file for complete search history.

(56) References Cited

U.S. PATENT DOCUMENTS 6,462,928 B1 * 10/2002 Shamouilian .......... H02N 13/00
361/234
2002/0036881 A1 * 3/2002 Shamouilian ......... C04B 35/565
279/128
(Continued)

FOREIGN PATENT DOCUMENTS

JP 2000-246574 A 9/2000
JP 5666748 B1 2/2015
(Continued)

OTHER PUBLICATIONS

Taiwanese Office Action (Application No. 110142187) dated Nov. 8, 2022.

*Primary Examiner* — Saul Rodriguez
*Assistant Examiner* — Brendan P Tighe
(74) *Attorney, Agent, or Firm* — BURR PATENT LAW, PLLC

(57) ABSTRACT

A member for semiconductor manufacturing apparatus includes an upper plate that has a wafer placement surface, that contains an electrostatic electrode and an upper auxiliary electrode parallel to each other, and that comprises ceramics; an intermediate plate that is joined to a surface of the upper plate opposite the wafer placement surface with a first metal joining layer interposed therebetween; and a lower plate that is joined to a surface of the intermediate plate opposite a surface joined to the upper plate with a second metal joining layer interposed therebetween and that contains a heater electrode and a lower auxiliary electrode parallel to each other.

8 Claims, 6 Drawing Sheets

(51) Int. Cl.
*H01L 21/683* (2006.01)
*H01J 37/32* (2006.01)

(56) References Cited

U.S. PATENT DOCUMENTS

| | | | |
|---|---|---|---|
| 2002/0075624 A1* | 6/2002 | Wang | H01L 21/6831 |
| | | | 361/234 |
| 2014/0209245 A1* | 7/2014 | Yamamoto | H01J 37/32091 |
| | | | 361/234 |
| 2014/0272378 A1 | 9/2014 | Jindo et al. | |
| 2015/0077895 A1 | 3/2015 | Jindo et al. | |
| 2016/0343600 A1 | 11/2016 | Parkhe | |
| 2017/0133258 A1 | 5/2017 | Miwa et al. | |
| 2018/0197758 A1 | 7/2018 | Parkhe | |
| 2021/0159098 A1 | 5/2021 | Parkhe | |

FOREIGN PATENT DOCUMENTS

| | | |
|---|---|---|
| JP | 2015/198942 A1 | 12/2015 |
| JP | 2018-518833 A | 7/2018 |
| TW | 201604990 A | 2/2016 |

\* cited by examiner

MEMBER FOR SEMICONDUCTOR MANUFACTURING APPARATUS AND METHOD FOR MANUFACTURING THE SAME

BACKGROUND OF THE INVENTION

1. Field of the Invention

The present invention relates to a member for semiconductor manufacturing apparatus and method for manufacturing the same.

2. Description of the Related Art

A known member for semiconductor manufacturing apparatus includes an upper plate that contains an electrostatic electrode and a heater electrode and that is composed of ceramics, an intermediate plate that is joined to a surface of the upper plate opposite a wafer placement surface with a first metal joining layer interposed therebetween and that is composed of a metal matrix material, and a lower plate that is joined to a surface of the intermediate plate opposite a surface that is joined to the upper plate with a second metal joining layer interposed therebetween and that is composed of ceramics (for example, PTL 1). In PTL 1, an upper puck plate corresponds to the upper plate, a lower puck plate corresponds to the intermediate plate, and a backing plate corresponds to the lower plate.

CITATION LIST

Patent Literature

PTL 1: JP 2018-518833 A

SUMMARY OF THE INVENTION

As for the member for semiconductor manufacturing apparatus described above, the electrostatic electrode and the heater electrode are contained in the upper plate. In some cases, however, the electrostatic electrode is to be contained in the upper plate, and the heater electrode is to be contained in the lower plate. In these cases, the electrostatic electrode is contained in the upper plate at a position near the wafer placement surface, and the heater electrode is contained in the lower plate at a position near a bonding surface. To manufacture such a member for semiconductor manufacturing apparatus, the upper plate, the intermediate plate, and the lower plate are prepared, and subsequently, these plates are joined to each other by metal joining.

However, in some case where the electrostatic electrode is contained in the upper plate at a position near the wafer placement surface, the upper plate deforms due to a difference in coefficient of thermal expansion between the electrostatic electrode and the ceramics of which the upper plate is composed after the upper plate is prepared by sintering. In some cases where the heater electrode is contained in the lower plate at a position near the bonding surface, the lower plate deforms due to a difference in coefficient of thermal expansion between the heater electrode and the ceramics of which the lower plate is composed after the lower plate is prepared by sintering. Joining the deforming upper plate or the deforming lower plate to the intermediate plate by metal joining causes an unbalanced load and degrades joining characteristics or causes residual stress due to restoring force of warping and damages the plates.

The present invention has been accomplished to solve the problems, and it is a main object of the present invention to provide a member for semiconductor manufacturing apparatus that includes an upper plate, an intermediate plate, and a lower plate that are joined to each other by metal joining, that has good joining characteristics, and that is unlikely to be damaged.

A member for semiconductor manufacturing apparatus according to the present invention includes: an upper plate that has a wafer placement surface, that contains an electrostatic electrode and an upper auxiliary electrode parallel to each other, and that is composed of ceramics; an intermediate plate that is joined to a surface of the upper plate opposite the wafer placement surface with a first metal joining layer interposed therebetween; and a lower plate that is joined to a surface of the intermediate plate opposite a surface joined to the upper plate with a second metal joining layer interposed therebetween and that contains a heater electrode and a lower auxiliary electrode parallel to each other.

As for the semiconductor-manufacturing apparatus member, the upper plate comprising (or composed of) ceramics contains the electrostatic electrode and the upper auxiliary electrode parallel to each other and is accordingly more likely to be flat than the case where only the electrostatic electrode is contained. The lower plate contains the heater electrode and the lower auxiliary electrode parallel to each other and is accordingly more likely to be flat than the case where only the heater electrode is contained. Consequently, an unbalanced load is unlikely to be applied when the upper plate, the intermediate plate, and the lower plate are joined to each other by metal joining, and joining characteristics are improved. In addition, the upper plate and the lower plate scarcely warp. Accordingly, residual stress due to restoring force of warping is prevented from occurring, and damage is unlikely to occur.

As for the word "parallel", the case of being incompletely parallel within tolerance is regarded as being parallel in addition to being completely parallel (the same shall apply hereafter). The words "upper" and "lower" do not represent a relationship in absolute position but represents a relationship in relative position. For this reason, the words "upper" and "lower" represent "left" and "right", "front" and "rear", or "lower" and "upper" depending on the direction of the member for semiconductor manufacturing apparatus (the same shall apply hereafter).

In the member for semiconductor manufacturing apparatus according to the present invention, the upper auxiliary electrode may be an electrode that is electrically connected to the electrostatic electrode with a via that is contained in the upper plate interposed therebetween, an electrode that is electrically connected to the intermediate plate, or an independent electrode that is electrically connected to neither the electrostatic electrode nor the intermediate plate.

In the member for semiconductor manufacturing apparatus according to the present invention, the lower auxiliary electrode may be an electrode that is electrically connected to the heater electrode with a via that is contained in the lower plate interposed therebetween or an independent electrode that is electrically connected to neither the heater electrode nor the intermediate plate.

In the member for semiconductor manufacturing apparatus according to the present invention, a thickness of the electrostatic electrode, a thickness of the upper auxiliary electrode, a position of the electrostatic electrode in the upper plate, and a position of the upper auxiliary electrode in the upper plate may be set such that the upper plate is flat, and a thickness of the heater electrode, a thickness of the lower auxiliary electrode, a position of the heater electrode in the lower plate, and a position of the lower auxiliary electrode in the lower plate may be set such that the lower plate is flat. As for the word "flat", the case of being incompletely flat within tolerance is regarded as being flat in addition to being completely flat (the same shall apply hereafter).

In the member for semiconductor manufacturing apparatus according to the present invention, the electrostatic electrode and the upper auxiliary electrode may be composed of the same material and may have the same thickness, a distance from the wafer placement surface of the upper plate to the electrostatic electrode may be equal to a distance from the surface opposite the wafer placement surface to the upper auxiliary electrode, the heater electrode and the lower auxiliary electrode may be composed of the same material and may have the same thickness, and a distance from a bonding surface of the lower plate to the heater electrode may be equal to a distance from a surface opposite the bonding surface to the lower auxiliary electrode. This makes the upper plate and the lower plate likely to be flat.

In the member for semiconductor manufacturing apparatus according to the present invention, an outer diameter of the electrostatic electrode may be equal to an outer diameter of the upper auxiliary electrode, and an outer diameter of the heater electrode may be equal to an outer diameter of the lower auxiliary electrode. As for the word "same", the case of being incompletely the same within tolerance is regarded as being the same in addition to being completely the same (the same shall apply hereafter).

In the member for semiconductor manufacturing apparatus according to the present invention, the intermediate plate may comprise (or may be composed of) a composite material of metal and ceramics or may comprise (or may be composed of) metal, and the lower plate may be composed of the same ceramics as the upper plate.

A method for manufacturing a member for semiconductor manufacturing apparatus according to the present invention includes (a) a step of preparing an upper plate that has a wafer placement surface, that contains an electrostatic electrode and an upper auxiliary electrode parallel to each other, and that is composed of ceramics, and a lower plate that contains a heater electrode and a lower auxiliary electrode parallel to each other, and an intermediate plate; and (b) a step of disposing a first metal joining material between an upper surface of the intermediate plate and a surface of the upper plate opposite the wafer placement surface, disposing a second metal joining material between a lower surface of the intermediate plate and an upper surface of the lower plate, and obtaining a joined body by adding heat under pressure in this state and returning temperature to room temperature.

The method for manufacturing a member for semiconductor manufacturing apparatus is suitable to manufacture the member for semiconductor manufacturing apparatus described above.

DETAILED DESCRIPTION OF THE INVENTION

Figure 1:
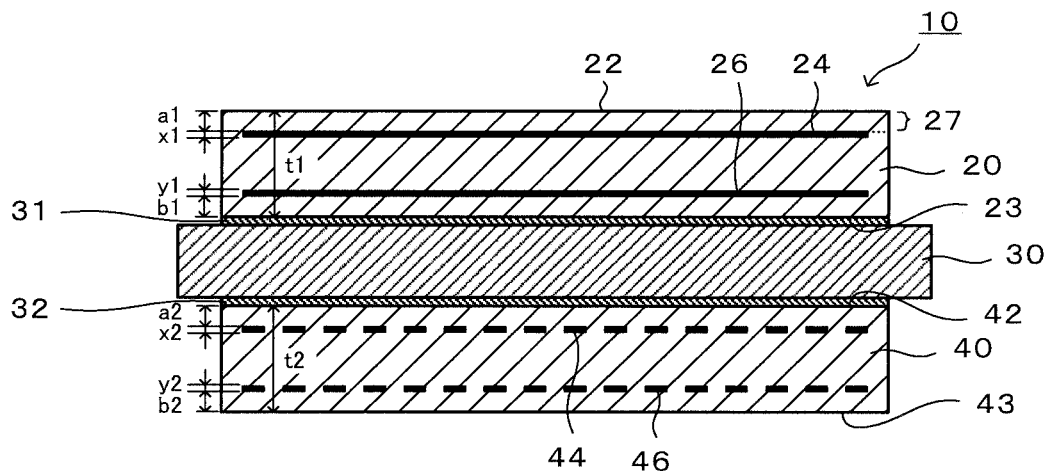
FIG. 1 is a sectional view of a member for semiconductor manufacturing apparatus 10.
Figure 2:
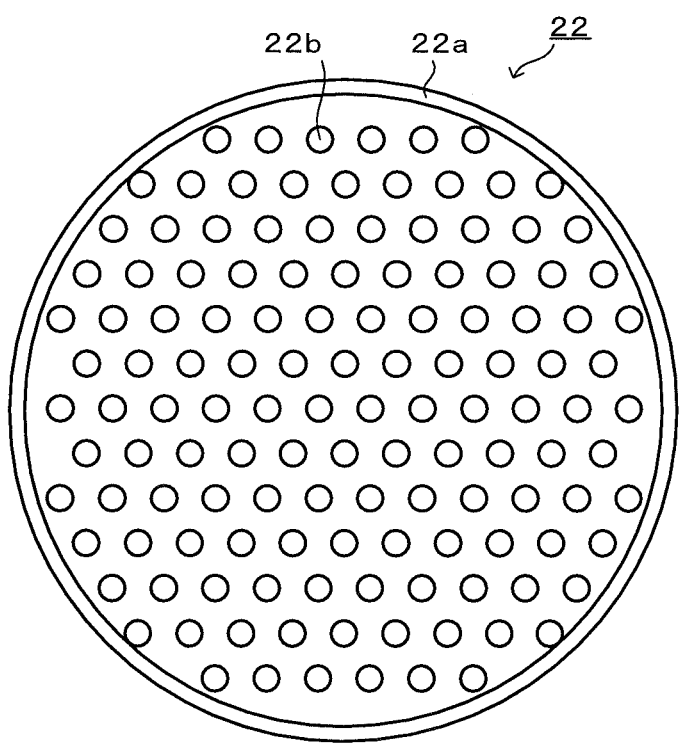
FIG. 2 is a plan view of a wafer placement surface 22.
Figure 3:
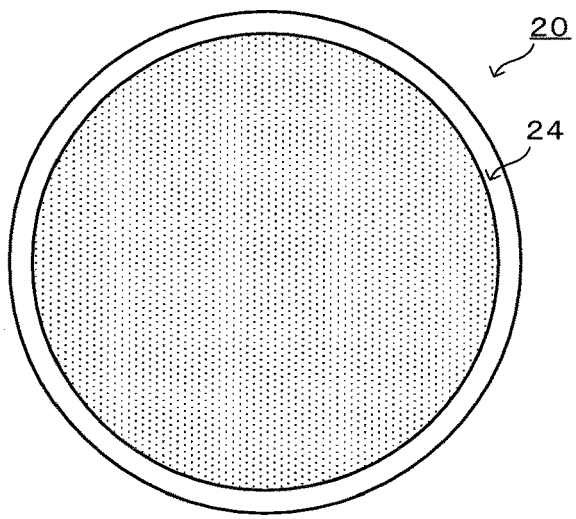
FIG. 3 is a plan view of an example of an electrostatic electrode 24 that is embedded in an upper plate 20.
Figure 4:
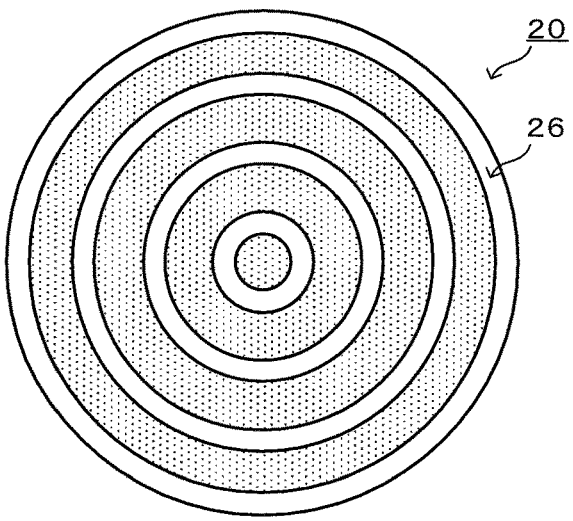
FIG. 4 is a plan view of an example of an upper auxiliary electrode 26 that is embedded in the upper plate 20.
Figure 5:
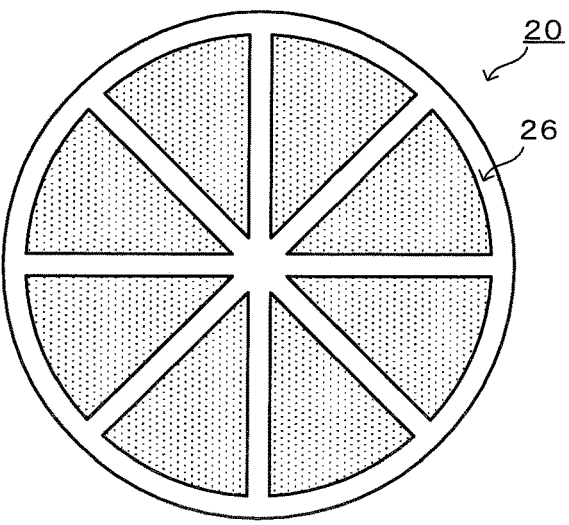
FIG. 5 is a plan view of an example of the upper auxiliary electrode 26 that is embedded in the upper plate 20.
Figure 6:
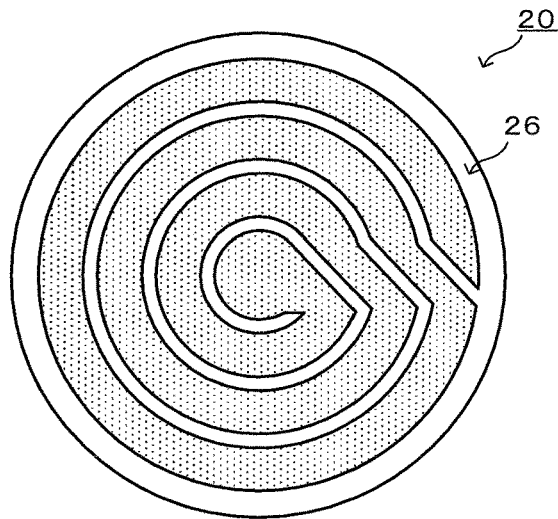
FIG. 6 is a plan view of an example of the upper auxiliary electrode 26 that is embedded in the upper plate 20.
Figure 7:
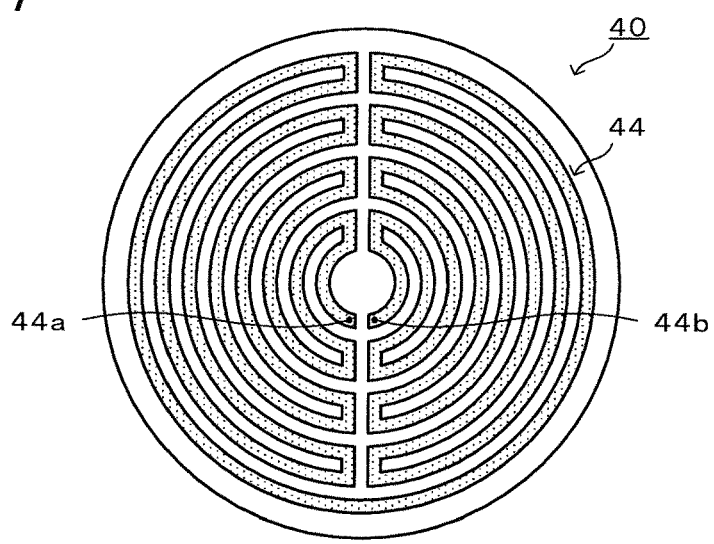
FIG. 7 is a plan view of an example of a heater electrode 44 that is embedded in a lower plate 40.

A preferred embodiment of the present invention will now be described with reference to the drawings. FIG. 1 is a sectional view of a member for semiconductor manufacturing apparatus 10 (a sectional view taken along a vertical plane that passes through the center of the member 10). FIG. 2 is a plan view of a wafer placement surface 22. FIG. 3 is a plan view of an example of an electrostatic electrode 24. FIG. 4 to FIG. 6 illustrate plan views of examples of an upper auxiliary electrode 26. FIG. 7 is a plan view of an example of a heater electrode 44.

As illustrated in FIG. 1, the member for semiconductor manufacturing apparatus 10 includes an upper plate 20, an intermediate plate 30, a lower plate 40, and first and second metal joining layers 31 and 32.

The upper plate 20 is a ceramic (for example, alumina or aluminum nitride) plate that has a disk shape and that has a diameter equal to that of a silicon wafer W on which a plasma process is to be performed and contains the electrostatic electrode 24 and the upper auxiliary electrode 26. For this reason, the upper plate 20 functions as an electrostatic chuck. For example, the diameter of the upper plate 20 may be, but not particularly limited to, 250 to 350 mm. An upper surface of the upper plate 20 is the wafer placement surface 22. As illustrated in FIG. 2, a seal band 22a is formed on the wafer placement surface 22 along the outer edge, and circular projections 22b are formed over the entire surface. The seal band 22a and the circular projections 22b have the same height, and the height thereof is, for example, several μm to several tens of μm.

As illustrated in FIG. 3, the electrostatic electrode 24 is a planar electrode that is concentric with the upper plate 20 and that has a circular shape and has a diameter slightly smaller than the diameter of the upper plate 20. The electrostatic electrode 24 can apply a direct voltage via a power supply terminal, not illustrated, by using an external power supply. A portion of the upper plate 20 between the wafer placement surface 22 and the electrostatic electrode 24 functions as a dielectric layer 27 (see FIG. 1). The thickness of the dielectric layer 27 is adjusted to a predetermined thickness (for example, 50 to 500 μm) in consideration for force for attracting the wafer W. When the DC voltage is applied to the electrostatic electrode 24, the wafer W that is placed on the wafer placement surface 22 is attracted and secured to the wafer placement surface 22. When applying the DC voltage ends, the wafer that is attracted and secured to the wafer placement surface 22 is released. A back surface of the wafer W that is attracted to the wafer placement surface 22 comes into contact with an upper surface of the seal band 22a and upper surfaces of the circular projections 22b. There are spaces between the back surface of the wafer W and portions of the wafer placement surface 22 on which neither the seal band 22a nor the circular projections 22b are disposed. A heat-transfer gas (for example, He gas) is supplied to the spaces via a gas supply path that extends through the member for semiconductor manufacturing apparatus 10 in the vertical direction and that is not illustrated. The heat-transfer gas enables the upper plate 20 and the wafer W to efficiently exchange heat.

The upper auxiliary electrode 26 has the same (or substantially the same) shape as the electrostatic electrode 24 in a plan view. For example, the upper auxiliary electrode 26 may be a planar electrode that has a circular shape in a plan view as in the electrostatic electrode 24, may be formed by dividing the planar electrode that has a circular shape by one or more concentric circumferences (for example, a concentric ring shape in FIG. 4), may be formed into sectorial shapes (for example, a cake cut shape in FIG. 5) obtained by equally or unequally dividing the planar electrode that has a circular shape by one or more radii, or may be formed into a spiral shape (for example, FIG. 6). According to the present embodiment, the upper auxiliary electrode 26 is an independent electrode that is electrically connected to neither the electrostatic electrode 24 nor the intermediate plate 30. The upper auxiliary electrode 26 may be connected to the ground.

The electrostatic electrode 24 and the upper auxiliary electrode 26 are parallel to the wafer placement surface 22. The electrostatic electrode 24 and the upper auxiliary electrode 26 may be composed of different materials or the same material but are preferably composed of the same material. Examples of the materials include high-melting-point metal such as tungsten, molybdenum, tantalum, platinum, rhenium, hafnium, and an alloy thereof, high-melting-point metal carbide such as tungsten carbide and molybdenum carbide, a mixture of the high-melting-point metal and ceramics, and a mixture of the high-melting-point metal carbide and ceramics. The electrostatic electrode 24 and the upper auxiliary electrode 26 may be formed by applying conductive paste or may be formed by using a conductive plate. Relational expressions (1) to (4) that are preferably satisfied are as follows:

$$4*a1 \geq b1 \geq a1, \quad (1)$$

$$0.5*t1 \geq a1, \quad (2)$$

$$0.75*t1 \geq b1, \quad (3)$$

and $$5*x1 \geq y1 \geq x1, \quad (4)$$

where t1 [mm] is the thickness of the upper plate 20, a1 [mm] is a distance from the wafer placement surface 22 to the electrostatic electrode 24, b1 [mm] is a distance from a surface 23 opposite the wafer placement surface 22 to the upper auxiliary electrode 26, x1 [μm] is the thickness of the electrostatic electrode 24, and y1 [μm] is the thickness of the upper auxiliary electrode 26.

The intermediate plate 30 has a disk shape and has a diameter larger than the diameters of the upper plate 20 and the lower plate 40. The intermediate plate 30 is joined to the surface 23 of the upper plate 20 opposite the wafer placement surface 22 with the first metal joining layer 31 interposed therebetween. Examples of the material of the intermediate plate 30 include a composite material and metal. An example of the composite material is a metal composite material (also referred to as a metal matrix composite (MMC)). Examples of the MMC include a material containing Si, SiC, and Ti (also referred to as SiSiCTi) and a material obtained by impregnating a SiC porous body with Al and/or Si. Examples of the metal include Ti and Mo.

The lower plate 40 is a ceramic plate that has a diameter equal to that of the upper plate 20 and that has a disk shape and contains the heater electrode 44 and a lower auxiliary electrode 46. The lower plate 40 is joined to the surface of the intermediate plate 30 opposite the surface that is joined to the upper plate 20 with the second metal joining layer 32 interposed therebetween.

As illustrated in FIG. 7, the heater electrode 44 is formed in a one-stroke pattern from an end 44a to another end 44b so as to extend over substantially the entire surface in the region of the lower plate 40 in a plan view, generates heat when a voltage is applied, and heats the wafer W. A region in which the heater electrode 44 extends is a circular region in a plan view. The heater electrode 44 can apply a voltage by using a heater power supply via the power supply terminal that is connected to the end 44a and the other end 44b and that is not illustrated.

The lower auxiliary electrode 46 has the same (or substantially the same) shape as the heater electrode 44 in a plan view. For example, the lower auxiliary electrode 46 may be a planar electrode that has a circular shape in a plan view as in the circular region in which the heater electrode 44 extends or may be formed into a concentric ring shape (FIG. 4), a cake cut shape (FIG. 5), or a spiral shape (FIG. 6) as described above as an example of the upper auxiliary electrode 26. According to the present embodiment, the lower auxiliary electrode 46 is an independent electrode that is electrically connected to neither the heater electrode 44 nor the intermediate plate 30. The lower auxiliary electrode 46 may be connected to the ground. In this case, the lower auxiliary electrode 46 can be used as an electrode that shields the heater electrode 44 from plasma.

The heater electrode 44 and the lower auxiliary electrode 46 are parallel to an upper surface 42 of the lower plate 40. The heater electrode 44 and the lower auxiliary electrode 46 may be composed of different materials or the same material but are preferably composed of the same material. Examples of the materials include high-melting-point metal such as tungsten, molybdenum, tantalum, platinum, rhenium, hafnium, and an alloy thereof, high-melting-point metal carbide such as tungsten carbide and molybdenum carbide, a mixture of the high-melting-point metal and ceramics, and a mixture of the high-melting-point metal carbide and ceramics. The heater electrode 44 and the lower auxiliary electrode 46 are preferably formed by applying conductive paste. Relational expressions (5) to (8) that are preferably satisfied are as follows:

$$4*a2 \geq b2 \geq a2, \quad (5)$$

$$0.5*t2 \geq a2, \quad (6)$$

$$0.75*t2 \geq b2, \quad (7)$$

and $$5*x2 \geq y2 \geq x2, \quad (8)$$

where t2 [mm] is the thickness of the lower plate 40, a2 [mm] is a distance from the upper surface 42 to the heater electrode 44, b2 [mm] is a distance from a lower surface 43 to the lower auxiliary electrode 46, x2 [μm] is the thickness of the heater electrode 44, and y2 [μm] is the thickness of the lower auxiliary electrode 46.

In the case where the materials of the upper plate 20 and the lower plate 40 are alumina, the material of the intermediate plate 30 is preferably SiSiCTi or metal Ti. In the case where the materials of the upper plate 20 and the lower plate 40 are aluminum nitride, the material of the intermediate plate 30 is preferably a material obtained by impregnating a SiC porous body with Si or metal Mo.

The first and second metal joining layers 31 and 32 are composed of a material containing Al such as an Al—Si—Mg or Al—Mg material. The thicknesses of the first and second metal joining layers 31 and 32 are not particularly limited but are preferably 1 to 300 μm, more preferably 50 to 150 μm. The outer circumference of the first metal joining layer 31 preferably does not protrude from the outer circumference of the upper plate 20. The outer circumference of the second metal joining layer 32 preferably does not protrude from the outer circumference of the lower plate 40. The first and second metal joining layers 31 and 32 are formed by, for example, TCB (Thermal compression bonding). The TCB is a known method for compressing and joining two members in a state in which the two members to be joined interpose the metal joining materials therebetween and are heated to a temperature equal to or less than the solidus temperature of the metal joining materials.

Figure 8:
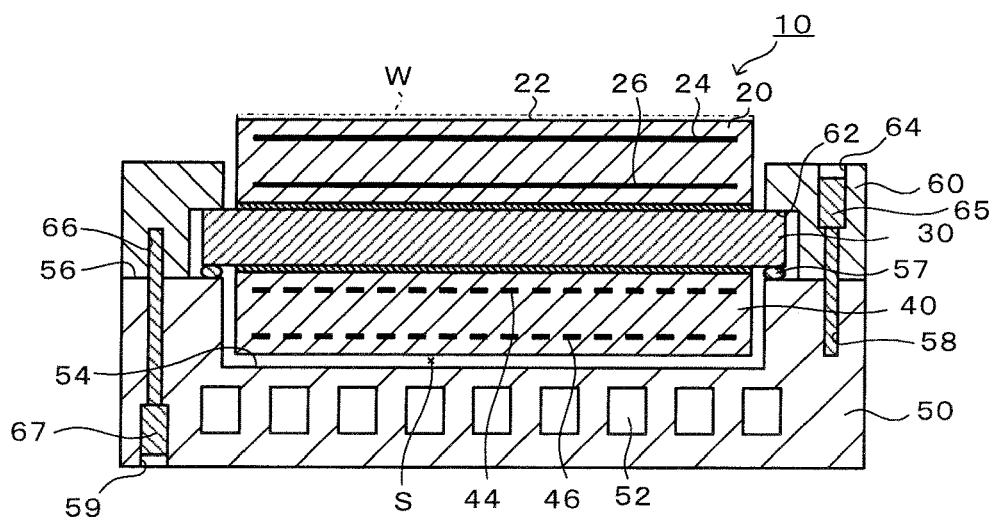
FIG. 8 is a sectional view of the member for semiconductor manufacturing apparatus 10 that is mounted on a cooling device 50.
Figure 9A:
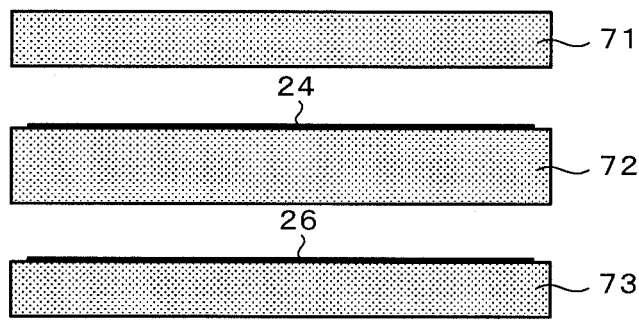
FIGS. 9A to 9D illustrate manufacturing process diagrams of the upper plate 20.
Figure 9B:
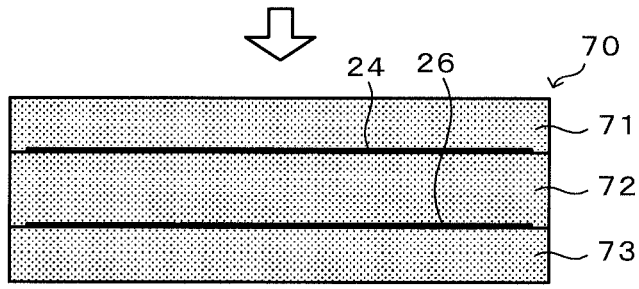
Figure 9C:
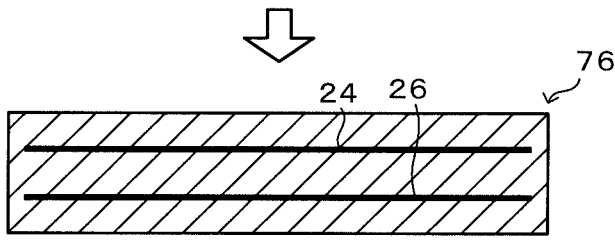
Figure 9D:
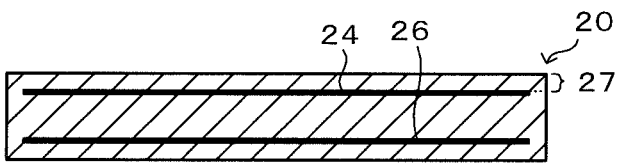

An example of the use of the member for semiconductor manufacturing apparatus 10 will now be described. FIG. 8 is a sectional view of the member for semiconductor manufacturing apparatus 10 that is mounted on a cooling device 50. The member for semiconductor manufacturing apparatus 10 is mounted on the cooling device 50 that is installed in a vacuum chamber, not illustrated. The cooling device 50 is a disk member composed of metal such as aluminum and contains a refrigerant passage 52 through which refrigerant can circulate. A circular groove 54 is formed at the center of an upper surface of the cooling device 50. The lower plate 40 is inserted in the circular groove 54. The cooling device 50 has an annular surface 56 that surrounds the circumference of the circular groove 54. The member for semiconductor manufacturing apparatus 10 is secured to the cooling device 50 by using a clamp ring 60 in a state in which a seal member 57 that has a ring shape is disposed between an outer circumferential portion of the lower surface of the intermediate plate 30 and the annular surface 56, and the lower plate 40 is inserted in the circular groove 54. The outer diameter of the seal member 57 is larger than the diameter of the circular groove 54 and is smaller than the diameter of the intermediate plate 30. An example of the seal member 57 is a metal gasket. The clamp ring 60 is disposed on the annular surface 56 of the cooling device 50. An inner circumferential surface of the clamp ring 60 has a step 62. The step 62 presses an upper surface of an outer circumferential portion of the intermediate plate 30 from above. The clamp ring 60 has vertical holes 64 in which screws 65 can be inserted and screw holes 66 in which screws 67 can be screwed. The screws 65 are inserted in the vertical holes 64 from above and are screwed in screw holes 58 that are formed in the annular surface 56 of the cooling device 50. The screws 67 are inserted in screw insertion holes 59 that extend through the cooling device 50 in the vertical direction from below and are screwed in the screw holes 66 that are formed in a back surface of the clamp ring 60. The multiple (for example, eight) screws 65 and 67 are arranged in the circumferential direction of the clamp ring 60 at regular intervals. Consequently, a space S that is surrounded by the circular groove 54, the lower plate 40, and the seal member 57 is sealed. The sealed space S is filled with a heat-transfer sheet or heat-transfer gas. The portion of the intermediate plate 30 of the member for semiconductor manufacturing apparatus 10 that protrudes outward from the upper plate 20 and the lower plate 40 is thus used as a flange for mounting on the cooling device 50.

After the member for semiconductor manufacturing apparatus 10 is mounted on the cooling device 50, the wafer W is placed on the wafer placement surface 22. The pressure of the vacuum chamber is decompressed by a vacuum pump and is adjusted such that a predetermined degree of vacuum is achieved. A DC voltage is applied to the electrostatic electrode 24, and the wafer W is attracted and secured to the wafer placement surface 22. The wafer W comes into close contact with the seal band 22a and the circular projections 22b (see FIG. 2) on the wafer placement surface 22 without a gap. Consequently, the spaces between the back surface of the wafer W and the portions of the wafer placement surface 22 on which neither the seal band 22a nor the circular projections 22b are disposed are sealed. The heat-transfer gas is supplied to the spaces. The heat-transfer gas is enclosed, and accordingly, heat is efficiently conducted between the upper plate 20 and the wafer W. Subsequently, a reactive gas atmosphere at a predetermined pressure (for example, several tens of Pa to several hundreds of Pa) is created in the vacuum chamber. In this state, plasma is generated. The surface of the wafer W is etched by the generated plasma. A controller, not illustrated, controls power that is supplied to the heater electrode 44 such that the temperature of the wafer W becomes a predetermined target temperature.

An example in which the member for semiconductor manufacturing apparatus 10 is manufactured will now be described. FIGS. 9A to 9D illustrate manufacturing process diagrams of the upper plate 20. FIGS. 10A to 10D illustrate manufacturing process diagrams of the member for semiconductor manufacturing apparatus 10. In the example described below, the materials of the upper plate 20 and the lower plate 40 are alumina, and the material of the intermediate plate 30 is SiSiCTi.

Figure 10A:
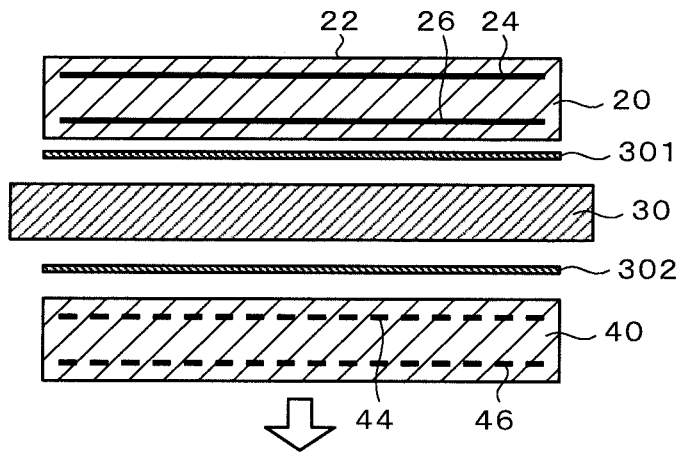
FIGS. 10A to 10D illustrate manufacturing process diagrams of the member for semiconductor manufacturing apparatus 10.
Figure 10B:
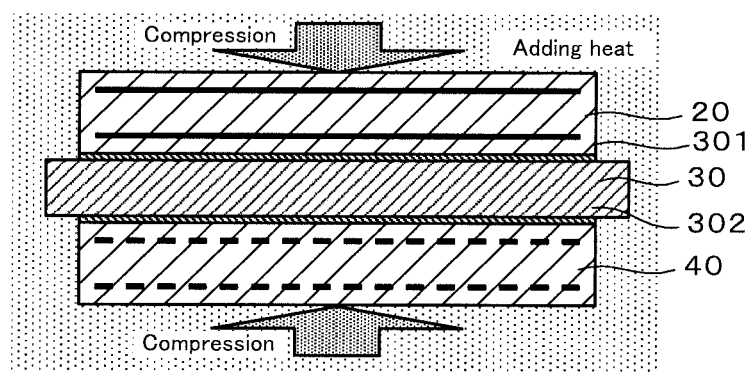
Figure 10C:
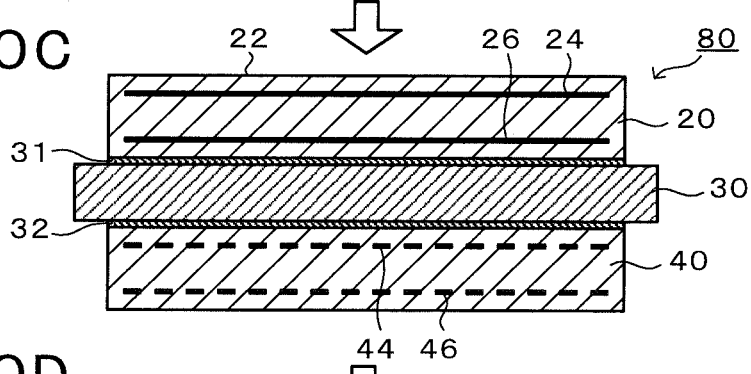
Figure 10D:
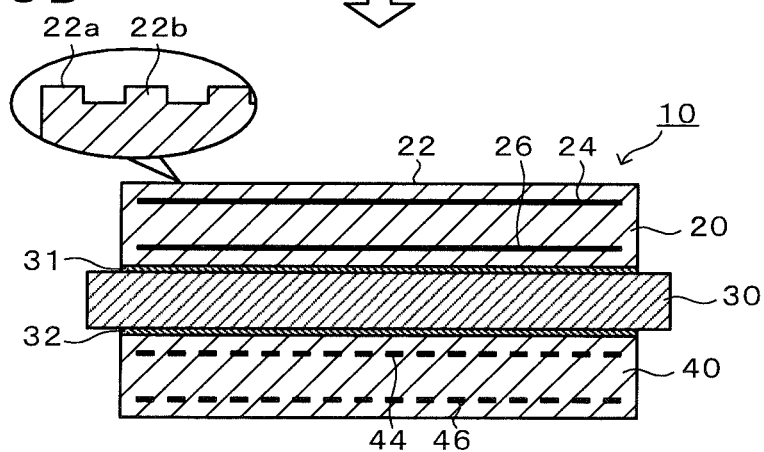

The upper plate 20, the intermediate plate 30, and the lower plate 40 are first prepared (see FIG. 10A). This step is referred to as a step (a).

The upper plate 20 can be manufactured in the following manner. In examples described herein with reference to FIGS. 9A to 9D, the upper plate 20 composed of alumina is manufactured. First to third MC sheets 71 to 73 that have a disk shape and that are composed of alumina are first prepared. MC is an abbreviation for mold cast and means a known method for obtaining a molded body by pouring ceramic slurry that contains ceramic material powder (here, alumina material powder) and a molding agent into a mold, causing the molding agent to chemically react in the mold, and molding the ceramic slurry. An example of the molding agent contains isocyanate and a polyol and is molded by a urethane reaction. Subsequently, the electrostatic electrode 24 is formed on a surface of the second MC sheet 72, and the upper auxiliary electrode 26 is formed on a surface of the third MC sheet 73 (see FIG. 9A). Examples of a method for forming the electrostatic electrode 24 and the upper auxiliary electrode 26 can include screen printing, PVD, CVD, and plating. Subsequently, the second MC sheet 72 is stacked on the surface of the third MC sheet 73 on which the upper auxiliary electrode 26 is formed such that the electrostatic electrode 24 faces upward, and the first MC sheet 71 is stacked thereon, and a multilayer body 70 is obtained (see FIG. 9B). Subsequently, the multilayer body 70 is fired by a hot press method, and consequently, an alumina sintered body 76 in which the electrostatic electrode 24 and the upper auxiliary electrode 26 are embedded is obtained (see FIG. 9C). The shape and the thickness are adjusted by performing, for example, a grinding process or a blasting process on both surfaces of the obtained alumina sintered body 76, and the upper plate 20 that has a flat plate shape is obtained (see FIG. 9D and FIG. 10A). At this time, the process is performed such that the thickness of the dielectric layer 27 is a predetermined thickness, but neither the seal band 22a nor the circular projections 22b are formed on the wafer placement surface 22. Green sheets may be used instead of the alumina MC sheets.

The intermediate plate 30 can be manufactured in the following manner. In an example describe herein, the intermediate plate 30 composed of SiSiCTi is manufactured. A disk member composed of SiSiCTi is first prepared. For example, a powder mixture is prepared so as to contain 39 to 51 mass % of silicon carbide material particles that have an average particle diameter of no less than 10 μm and no more than 25 μm and so as to contain one or more kinds of materials that are selected such that the materials contain Ti and Si, and such that a mass ratio of Si/(Si+Ti) regarding Si and Ti that are derived from materials except for silicon carbide is 0.26 to 0.54. Examples of the materials can be silicon carbide, metal Si, and metal Ti. In this case, the materials are preferably mixed such that 39 to 51 mass % of silicon carbide, 16 to 24 mass % of metal Si, and 26 to 43 mass % of metal Ti are contained. Subsequently, a molded body that has a disk shape is prepared from the obtained powder mixture by uniaxial pressing molding, the molded body is sintered at 1370 to 1460° C. in an inert atmosphere by hot pressing, and consequently, the disk member composed of SiSiCTi is obtained. Pressure during the hot pressing is set to, for example, 50 to 300 kgf/cm$^2$. Subsequently, the shape and thickness of the obtained disk member are adjusted by, for example, the grinding process, and the intermediate plate 30 is obtained (see FIG. 10A). Specific conditions in which the intermediate plate 30 is manufactured may be set by referring conditions disclosed in, for example, Japanese Patent No. 5666748.

The lower plate 40 can be manufactured in the following manner. In an example described herein, the lower plate 40 composed of alumina is manufactured. First to third MC sheets that have a disk shape and that are composed of alumina are first prepared as in the case where the upper plate 20 is manufactured. Subsequently, the heater electrode 44 is formed on a surface of the second MC sheet, and the lower auxiliary electrode 46 is formed on a surface of the third MC sheet. Examples of a method for forming the heater electrode 44 and the lower auxiliary electrode 46 can include screen printing, PVD, CVD, and plating. Subsequently, the second MC sheet is stacked on the surface of the third MC sheet on which the lower auxiliary electrode 46 is formed such that the heater electrode 44 faces upward, and the first MC sheet is stacked thereon, and a multilayer body is obtained. Subsequently, the multilayer body is fired by the hot press method, and consequently, an alumina sintered body in which the heater electrode 44 and the lower auxiliary electrode 46 are embedded is obtained. The shape and the thickness are adjusted by performing, for example, the grinding process or the blasting process on both surfaces of the obtained alumina sintered body, and the lower plate 40 that has a flat plate shape is obtained (see FIG. 10A). Green sheets may be used instead of the alumina MC sheets.

Subsequently, a second metal joining material 302 that has the same diameter as the lower plate 40 and that has a flat plate shape is placed on the upper surface of the lower plate 40, the intermediate plate 30 is placed thereon, a first metal joining material 301 that has the same diameter as the upper plate 20 and that has a flat plate shape is placed on the upper surface of the intermediate plate 30, and the upper plate 20 is placed such that the lower surface of the upper plate 20 is in contact with the first metal joining material 301. Consequently, a sandwich multilayer body is obtained with the upper plate 20 and the lower plate 40 sandwiched together with the intermediate plate 30 and with the metal joining materials 301 and 302 interposed therebetween. Subsequently, the sandwich multilayer body is compressed at a temperature equal to or less than the solidus temperature of the first and second metal joining materials 301 and 302 (for example, no less than a temperature obtained by subtracting 20° C. from the solidus temperature and no more than the solidus temperature), the upper plate 20, the intermediate plate 30, and the lower plate 40 are joined to each other by the TCB (see FIG. 10B), and subsequently, the temperature is returned to the room temperature. Consequently, a joined body 80 that includes the first metal joining layer 31 changed from the first metal joining material 301 and the second metal joining layer 32 changed from the second metal joining material 302 is obtained (see FIG. 10C). This step is referred to as a step (b). An Al—Mg joining material or an Al—Si—Mg joining material can be used as the first and second metal joining materials 301 and 302. For example, in the case where the Al—Si—Mg joining material (88.5 weight % of Al, 10 weight % of Si, and 1.5 weight % of Mg are contained, and the solidus temperature is about 560° C.) is used for the TCB, the upper plate 20 is compressed for several hours at a pressure of 0.5 to 2.0 kg/mm$^2$ (for example, 1.5 kg/mm$^2$) in a vacuum atmosphere while being heated to 540 to 560° C. (for example, 550° C.). The first and second metal joining materials 301 and 302 preferably have a thickness of about 100 μm.

Subsequently, a pattern mask that has holes at positions at which the seal band 22a and the circular projections 22b are not to be formed is bonded to the wafer placement surface 22 of the upper plate 20 of the joined body 80, and a blasting medium is sprayed for the blasting process. The seal band 22a and the circular projections 22b are formed on the wafer placement surface 22 by the blasting process. This step is referred to as a step (c). Subsequently, the mask is removed, and the member for semiconductor manufacturing apparatus 10 is obtained (see FIG. 10D).

As for the member for semiconductor manufacturing apparatus 10 described above in detail, the upper plate 20 composed of ceramics contains the electrostatic electrode 24 and the upper auxiliary electrode 26 parallel to each other and is accordingly more likely to be flat than the case where only the electrostatic electrode is contained. The lower plate 40 composed of ceramics contains the heater electrode 44 and the lower auxiliary electrode 46 parallel to each other and is accordingly more likely to be flat than the case where only the heater electrode is contained. Consequently, an unbalanced load is unlikely to be applied when the upper plate 20, the intermediate plate 30, and the lower plate 40 are joined to each other by metal joining, and joining characteristics are improved. In addition, the upper plate 20 and the lower plate 40 scarcely warp. Accordingly, residual stress due to restoring force of warping is prevented from occurring, and damage is unlikely to occur.

The intermediate plate 30 is composed of a composite material of metal and ceramics, and the upper plate 20 and the lower plate 40 are composed of the same ceramics. Accordingly, the member for semiconductor manufacturing apparatus 10 is unlikely to warp.

A method for manufacturing the member for semiconductor manufacturing apparatus 10 includes (a) a step of preparing the upper plate 20, the lower plate 40, and the intermediate plate 30 and (b) a step of disposing the first metal joining material 301 between the upper surface of the intermediate plate 30 and the surface 23 of the upper plate 20 opposite the wafer placement surface 22, disposing the second metal joining material 302 between the lower surface of the intermediate plate 30 and the upper surface of the lower plate 40, and obtaining the joined body 80 by adding heat under pressure in this state and returning the temperature to the room temperature. The manufacturing method is suitable to manufacture the member for semiconductor manufacturing apparatus 10 described above.

It goes without saying that the present invention is not limited to the above embodiment at all and can be carried out with various embodiments within the technical scope of the present invention.

Figure 11:
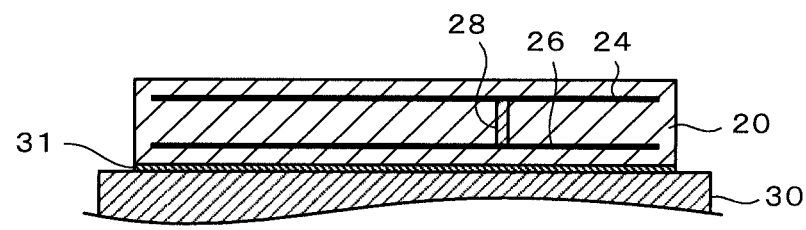
FIG. 11 is a partial, sectional view of another example of the upper plate 20.
Figure 12:
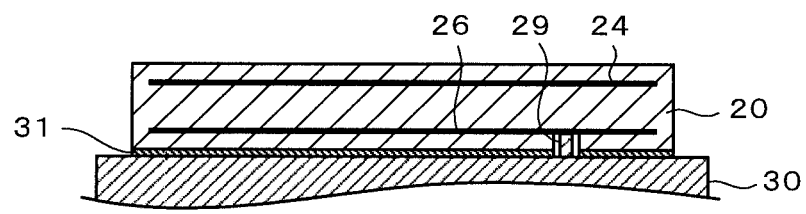
FIG. 12 is a partial, sectional view of another example of the upper plate 20.

According to the embodiment describe above, the upper auxiliary electrode 26 is an independent electrode that is electrically connected to nether the electrostatic electrode 24 nor the intermediate plate 30 but is not limited thereto. For example, as illustrated in FIG. 11, the upper auxiliary electrode 26 may be electrically connected to the electrostatic electrode 24 with a via 28 that is contained in the upper plate 20 interposed therebetween. In this case, the upper auxiliary electrode 26 may be used as a jumper wire for the electrostatic electrode 24. Alternatively, as illustrated in FIG. 12, the upper auxiliary electrode 26 may be electrically connected to the intermediate plate 30 with a via 29 interposed therebetween. In this case, the upper auxiliary electrode 26 may be used as a RF electrode by supplying RF power to the intermediate plate 30. In FIG. 11 and FIG. 12, the same components as those according to the embodiment described above are designated by the same reference characters.

Figure 13:
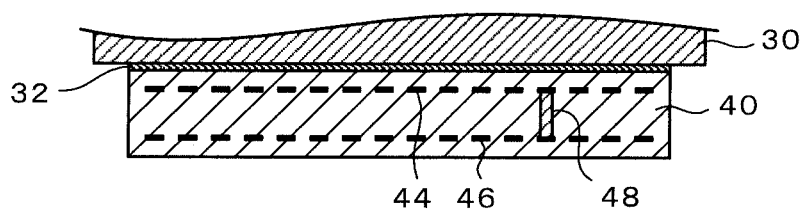
FIG. 13 is a partial, sectional view of another example of the lower plate 40.

According to the embodiment described above, the lower auxiliary electrode 46 is an independent electrode that is electrically connected to neither the heater electrode 44 nor the intermediate plate 30 but is not limited thereto. For example, as illustrated in FIG. 13, the lower auxiliary electrode 46 may be electrically connected to the heater electrode 44 with a via 48 that is contained in the lower plate 40 interposed therebetween. In this case, the lower auxiliary electrode 46 may be used as a jumper wire for the heater electrode 44. In FIG. 13, the same components as those according to the embodiment described above are designated by the same reference characters.

According to the embodiment described above, the thickness x1 [μm] of the electrostatic electrode 24, the thickness y1 [μm] of the upper auxiliary electrode 26, the position of the electrostatic electrode 24 in the upper plate 20 (the distance a1 [mm]), and the position of the upper auxiliary electrode 26 in the upper plate 20 (the distance b1 [mm]) are preferably set such that the upper plate 20 is flat. The thickness x2 [μm] of the heater electrode 44, the thickness y2 [μm] of the lower auxiliary electrode 46, the position of the heater electrode 44 in the lower plate 40 (the distance a2 [mm]), and the position of the lower auxiliary electrode 46 in the lower plate 40 (the distance b2 [mm]) are preferably set such that the lower plate 40 is flat.

According to the embodiment described above, the electrostatic electrode 24 and the upper auxiliary electrode 26 are preferably composed of the same material and preferably have the same thickness, and the distance a1 is preferably equal to the distance b1. The heater electrode 44 and the lower auxiliary electrode 46 are preferably composed of the same material and preferably have the same thickness, and the distance a2 is preferably equal to the distance b2. This makes the upper plate 20 and the lower plate 40 likely to be flat.

According to the embodiment described above, the seal band 22a and the circular projections 22b are not formed on the upper plate 20 that is prepared at the step (a). However, the seal band 22a and the circular projections 22b may be formed on the upper plate 20 by blasting process at this step. In this case, the step (c) is not needed.

According to the embodiment described above, the diameter of the upper plate 20 is equal to the diameter of the wafer W. However, the diameter of the upper plate 20 may be larger than the diameter of the wafer W, or the diameter of the upper plate 20 may be smaller than the diameter of the wafer W.

According to the embodiment described above, the heater electrode 44 is disposed so as to cover substantially the entire surface in the region of the lower plate 40 in a plan view. However, the region of the lower plate 40 in the plan view may be divided into a circular middle zone and an annular zone outside the circular middle zone, and heater electrodes may be disposed in the respective zones. The annular zone may be divided into multiple zones, and heater electrodes may be disposed in the respective divided zones.

According to the embodiment described above, the electrostatic electrode 24 and the upper auxiliary electrode 26 may be formed so as to overlap in a plan view of the upper plate 20. The heater electrode 44 and the lower auxiliary electrode 46 may be formed so as to overlap in a plan view of the lower plate 40.

According to the embodiment described above, a corrosion resistance protection film may be disposed on side surfaces of the first and second metal joining layers 31 and 32, a portion of the intermediate plate 30 that is exposed to the outside, or a portion of the intermediate plate 30 that is exposed to a through-hole (for example, a lift pin hole or a gas hole) that extends through the member for semiconductor manufacturing apparatus 10 in the vertical direction in order to prevent corrosion due to environmental atmosphere. An example of the corrosion resistance protection film is a ceramic thermal spray film.

According to the embodiment described above, the heater electrode 44 is embedded in the lower plate 40 near the upper surface, and the lower auxiliary electrode 46 is embedded therein near the lower surface, but this is not a limitation. For example, the lower auxiliary electrode may be embedded in the lower plate 40 near the upper surface, and the heater electrode may be embedded therein near the lower surface. In this case, the intermediate plate 30 may be connected to a RF power source (that is, the intermediate plate 30 is used as the RF electrode), and the lower auxiliary electrode may be connected to the ground. This enables the lower auxiliary electrode to prevent a RF current from flowing from the intermediate plate 30 into the heater electrode and accordingly prevents control on the temperature of the heater electrode from being adversely affected due to a RF current that flows into the heater electrode.

EXAMPLES

Preferred examples of the present invention will now be described. The present invention is not limited by the examples below at all. Experimental examples 1 to 5, and 7 to 9 correspond to the examples of the present invention, and an experimental example 6 corresponds to a comparative example. The results thereof are illustrated in Table 1.

electrode 24 was equal to the distance from the lower surface to the upper auxiliary electrode 26 as for the alumina sintered body 76 that was obtained by firing the multilayer body 70. When the upper surface and lower surface of the alumina sintered body 76 were cut, the distance a1 from the upper surface to the electrostatic electrode 24 was equal to the distance b1 from the lower surface to the upper auxiliary electrode 26. Specific dimensions of the upper plate 20 and the shapes of the electrodes are shown in Table 1. The shape of the obtained upper plate 20 was flat. The outer diameter of the upper plate 20 was 300 mm, and the outer diameter

TABLE 1

| | | Experimental Example 1 | Experimental Example 2 | Experimental Example 3 | Experimental Example 4 | Experimental Example 5 | Experimental Example 6 | Experimental Example 7 | Experimental Example 8 | Experimental Example 9 |
|---|---|---|---|---|---|---|---|---|---|---|
| Upper plate | Coefficient of thermal expansion (CTE) | Electrostatic electrode 6.0 ppm/K Upper auxiliary electrode 6.0 ppm/K Ceramic 8.0 ppm/K | | | | | | Electrostatic electrode 5.5 ppm/K Upper auxiliary electrode 6.0 ppm/K Ceramic 8.0 ppm/K | | |
| | Thickness of the plate t1[mm] | 4 | 4 | 4 | 4 | 4 | 4 | 4 | 4 | 4 |
| | Distance a1[mm] | 0.5 | 0.5 | 0.5 | 0.5 | 0.5 | 0.5 | 0.5 | 0.5 | 0.2 |
| | Distance b1[mm] | 0.5 | 0.5 | 0.5 | 0.5 | 0.75 | None | 0.75 | 0.75 | 0.5 |
| | Thickness of the electrode x1[μm] | 30 | 30 | 30 | 30 | 30 | 30 | 30 | 30 | 30 |
| | Thickness of the electrode y1[μm] | 30 | 30 | 30 | 60 | 60 | None | 30 | 60 | 30 |
| | Shape of the electrostatic electrode | Disk | Disk | Cake cut | Disk | Disk | Disk | Disk | Disk | Disk |
| | Shape of the upper auxiliary electrode | Disk | One-stroke pattern | Disk | Disk | Disk | None | Disk | Disk | Disk |
| | Shape | Flat | Flat | Flat | Convex (0.1 mm) | Flat | Concave (0.2 mm) | Concave (0.1 mm) | Flat | Flat |
| Lower plate | Coefficient of thermal expansion (CTE) | Heater electrode 6.0 ppm/K Lower auxiliary electrode 6.0 ppm/K Ceramic 8.0 ppm/K | | | | | | Heater electrode 5.5 ppm/K Lower auxiliary electrode 6.0 ppm/K Ceramic 8.0 ppm/K | | |
| | Thickness of the plate t2[mm] | 4 | 4 | 4 | 4 | 4 | 4 | 4 | 4 | 4 |
| | Distance a2[mm] | 0.5 | 0.5 | 0.5 | 0.5 | 0.5 | 0.5 | 0.5 | 0.5 | 0.2 |
| | Distance b2[mm] | 0.5 | 0.5 | 0.5 | 0.5 | 0.75 | None | 0.75 | 0.75 | 0.5 |
| | Thickness of the electrode x2[μm] | 30 | 30 | 30 | 30 | 30 | 30 | 30 | 30 | 30 |
| | Thickness of the electrode y2[μm] | 30 | 30 | 30 | 60 | 60 | None | 30 | 60 | 30 |
| | Shape of the heater electrode | One-stroke pattern | One-stroke pattern | Cake cut | One-stroke pattern | One-stroke pattern | One-stroke pattern | One-stroke pattern | One-stroke pattern | One-stroke pattern |
| | Shape of the lower auxiliary electrode | One-stroke pattern | Disk | One-stroke pattern | One-stroke pattern | One-stroke pattern | None | One-stroke pattern | One-stroke pattern | One-stroke pattern |
| | Shape | Flat | Flat | Flat | Convex (0.1 mm) | Flat | Concave (0.2 mm) | Concave (0.1 mm) | Flat | Flat |

※"Cake cut" is the shape shown in FIG. 5. and "One-stroke pattern" is the shape shown in FIG. 7.

Experimental Example 1

The member for semiconductor manufacturing apparatus 10 according to the embodiment described above was manufactured by the manufacturing method described above. The upper plate 20 and the lower plate 40 were composed of $Al_2O_3$, the electrodes 24, 26, 44, and 46 were composed of WC (tungsten carbide). The intermediate plate 30 was composed of SiSiCTiC. The coefficient of thermal expansions CTE (40 to 570° C.) of each material is shown in Table 1.

Regarding the upper plate 20, the distance from the upper surface to the electrostatic electrode 24 was equal to the distance from the lower surface to the upper auxiliary electrode 26 when the multilayer body 70 was prepared by using the first to third MC sheets 71 to 73. For this reason, the distance from the upper surface to the electrostatic electrode 24 was equal to the distance from the lower surface to the upper auxiliary electrode 26 as for the alumina sintered body 76 that was obtained by firing the multilayer body 70. When the upper surface and lower surface of the alumina sintered body 76 were cut, the distance a1 from the upper surface to the electrostatic electrode 24 was equal to the distance b1 from the lower surface to the upper auxiliary electrode 26. Specific dimensions of the upper plate 20 and the shapes of the electrodes are shown in Table 1. The shape of the obtained upper plate 20 was flat. The outer diameter of the upper plate 20 was 300 mm, and the outer diameter of the electrostatic electrode 24 and the outer diameter of the upper auxiliary electrode 26 were 296 mm.

The lower plate 40 was prepared in the same manner as in the upper plate 20. When the distance from the upper surface to the heater electrode 44 was equal to the distance from the lower surface to the lower auxiliary electrode 46 when the multilayer body was prepared by using the first to third MC sheets. For this reason, the distance from the upper surface to the heater electrode 44 was equal to the distance from the lower surface to the lower auxiliary electrode 46 as for the alumina sintered body that was obtained by firing the multilayer body. When the upper surface and lower surface of the alumina sintered body were cut, the distance a2 from the upper surface to the heater electrode 44 was equal to the distance b2 from the lower surface to the lower auxiliary electrode 46. Specific dimensions of the lower plate 40 and the shapes of the electrodes are shown in Table 1. The shape of the obtained lower plate 40 was flat. The outer diameter of the lower plate 40 was 300 mm, and the outer diameter of the heater electrode 44 and the outer diameter of the lower auxiliary electrode 46 were 296 mm.

The first metal joining material 301 was disposed between the upper plate 20 and the intermediate plate 30, and the second metal joining material 302 was disposed between the lower plate 40 and the intermediate plate 30. The upper plate 20, the intermediate plate 30, and the lower plate 40 were joined to each other by the TCB. The first and second metal joining materials 301 and 302 were Al—Si—Mg joining materials.

The upper plate 20, the intermediate plate 30, and the lower plate 40 were flat. Accordingly, an unbalanced load was unlikely to be applied during metal joining, and joining was successfully performed. The upper plate 20 and the lower plate 40 did not warp. Accordingly, residual stress due to restoring force of warping was prevented from occurring.

Experimental Example 2

Conditions shown for the experimental example 2 in Table 1 were used, and the member for semiconductor manufacturing apparatus 10 was manufactured in the same manner as in the experimental example 1. The upper plate 20, the intermediate plate 30, and the lower plate 40 were flat. Accordingly, an unbalanced load was unlikely to be applied during metal joining, and joining was successfully performed. The upper plate 20 and the lower plate 40 did not warp. Accordingly, residual stress due to restoring force of warping was prevented from occurring. In the case where the shape of the upper auxiliary electrode 26 was changed to the concentric ring shape (see FIG. 4) in the experimental example 2, the same effects as in the experimental example 2 were achieved.

Experimental Example 3

Conditions shown for the experimental example 3 in Table 1 were used, and the member for semiconductor manufacturing apparatus 10 was manufactured in the same manner as in the experimental example 1. The upper plate 20, the intermediate plate 30, and the lower plate 40 were flat. Accordingly, an unbalanced load was unlikely to be applied during metal joining, and joining was successfully performed. The upper plate 20 and the lower plate 40 did not warp. Accordingly, residual stress due to restoring force of warping was prevented from occurring. In the case where the shape of the upper auxiliary electrode 26 was changed from the disk shape to the concentric ring shape (see FIG. 4) and the spiral shape (see FIG. 6) in the experimental example 3, the same effects as in the experimental example 3 were achieved.

Experimental Example 4

Conditions shown for the experimental example 4 in Table 1 were used, and the member for semiconductor manufacturing apparatus 10 was manufactured in the same manner as in the experimental example 1. The upper plate 20 had a convex shape (a difference $\Delta h1$ between the maximum height and the minimum height was 0.1 mm). Also, the lower plate 40 had a convex shape (a difference $\Delta h2$ between the maximum height and the minimum height was 0.1 mm). Because $\Delta h1$ and $\Delta h2$ were within a permissible range (within 0.1 mm), an unbalanced load was unlikely to be applied during metal joining, and joining was successfully performed. Because $\Delta h1$ and $\Delta h2$ were within the permissible range, residual stress due to restoring force of warping was prevented from occurring.

Experimental Example 5

Conditions shown for the experimental example 5 in Table 1 were used, and the member for semiconductor manufacturing apparatus 10 was manufactured in the same manner as in the experimental example 1. The upper plate 20, the intermediate plate 30, and the lower plate 40 were flat. Accordingly, an unbalanced load was unlikely to be applied during metal joining, and joining was successfully performed. The upper plate 20 and the lower plate 40 did not warp. Accordingly, residual stress due to restoring force of warping was prevented from occurring.

Experimental Example 6

Conditions shown for the experimental example 6 in Table 1 were used, and the member for semiconductor manufacturing apparatus 10 was manufactured in the same manner as in the experimental example 1. The upper plate 20 and the lower plate 40 had a concave shape, and $\Delta h1$ and $\Delta h2$ were 0.2 mm and out of the permissible range. Accordingly, an unbalanced load was applied during metal joining, and joining was not successfully performed. In addition, residual stress due to restoring force of warping was not prevented from occurring.

Experimental Example 7

Conditions shown for the experimental example 7 in Table 1 were used, and the member for semiconductor manufacturing apparatus 10 was manufactured in the same manner as in the experimental example 1. The upper plate 20 and the lower plate 40 had a concave shape. Because $\Delta h1$ and $\Delta h2$ were 0.1 mm and within the permissible range (within 0.1 mm), an unbalanced load was unlikely to be applied during metal joining, and joining was successfully performed. Because $\Delta h1$ and $\Delta h2$ were within the permissible range, residual stress due to restoring force of warping was prevented from occurring.

Experimental Example 8

Conditions shown for the experimental example 8 in Table 1 were used, and the member for semiconductor manufacturing apparatus 10 was manufactured in the same manner as in the experimental example 1. The upper plate 20, the intermediate plate 30, and the lower plate 40 were flat. Accordingly, an unbalanced load was unlikely to be applied during metal joining, and joining was successfully performed. The upper plate 20 and the lower plate 40 did not warp. Accordingly, residual stress due to restoring force of warping was prevented from occurring.

Experimental Example 9

Conditions shown for the experimental example 9 in Table 1 were used, and the member for semiconductor manufacturing apparatus 10 was manufactured in the same manner as in the experimental example 1. The upper plate 20, the intermediate plate 30, and the lower plate 40 were flat. Accordingly, an unbalanced load was unlikely to be applied during metal joining, and joining was successfully performed. The upper plate 20 and the lower plate 40 did not warp. Accordingly, residual stress due to restoring force of warping was prevented from occurring.

The present application claims priority from Japanese Patent Application No. 2021-016206, filed on Feb. 4, 2021, the entire contents of which are incorporated herein by reference.

What is claimed is:

1. A member for semiconductor manufacturing apparatus comprising:
   an upper plate that has a wafer placement surface, that contains an electrostatic electrode and an upper auxiliary electrode parallel to each other, and that comprises ceramics;
   an intermediate plate that is joined to a surface of the upper plate opposite the wafer placement surface with a first metal joining layer interposed therebetween; and
   a lower plate that is joined to a surface of the intermediate plate opposite a surface joined to the upper plate with a second metal joining layer interposed therebetween and that contains a heater electrode and a lower auxiliary electrode parallel to each other; and
   wherein the diameter of the intermediate plate is larger than the diameters of the upper plate and the lower plate.

2. The member for semiconductor manufacturing apparatus according to claim 1,
   wherein the upper auxiliary electrode is an electrode that is electrically connected to the electrostatic electrode with a via that is contained in the upper plate interposed therebetween, an electrode that is electrically connected to the intermediate plate, or an independent electrode that is electrically connected to neither the electrostatic electrode nor the intermediate plate.

3. The member for semiconductor manufacturing apparatus according to claim 1,
   wherein the lower auxiliary electrode is an electrode that is electrically connected to the heater electrode with a via that is contained in the lower plate interposed therebetween or an independent electrode that is electrically connected to neither the heater electrode nor the intermediate plate.

4. The member for semiconductor manufacturing apparatus according to claim 1,
   wherein a thickness of the electrostatic electrode, a thickness of the upper auxiliary electrode, a position of the electrostatic electrode in the upper plate, and a position of the upper auxiliary electrode in the upper plate are set such that the upper plate is flat, and
   wherein a thickness of the heater electrode, a thickness of the lower auxiliary electrode, a position of the heater electrode in the lower plate, and a position of the lower auxiliary electrode in the lower plate are set such that the lower plate is flat.

5. The member for semiconductor manufacturing apparatus according to claim 1,
   wherein the electrostatic electrode and the upper auxiliary electrode are composed of the same material and have the same thickness, and a distance from the wafer placement surface of the upper plate to the electrostatic electrode is equal to a distance from the surface opposite the wafer placement surface to the upper auxiliary electrode, and
   wherein the heater electrode and the lower auxiliary electrode are composed of the same material and have the same thickness, and a distance from a bonding surface of the lower plate to the heater electrode is equal to a distance from a surface opposite the bonding surface to the lower auxiliary electrode.

6. The member for semiconductor manufacturing apparatus according to claim 1,
   wherein an outer diameter of the electrostatic electrode is equal to an outer diameter of the upper auxiliary electrode, and
   wherein an outer diameter of the heater electrode is equal to an outer diameter of the lower auxiliary electrode.

7. The member for semiconductor manufacturing apparatus according to claim 1,
   wherein the intermediate plate comprises a composite material of metal and ceramics or comprises a metal, and the lower plate is composed of the same ceramics as the upper plate.

8. A method for manufacturing a member for semiconductor manufacturing apparatus, the method comprising:
   (a) a step of preparing an upper plate that has a wafer placement surface, that contains an electrostatic electrode and an upper auxiliary electrode parallel to each other, and that comprises ceramics, and a lower plate that contains a heater electrode and a lower auxiliary electrode parallel to each other, and an intermediate plate whose diameter is larger than the diameters of the upper plate and the lower plate; and
   (b) a step of disposing a first metal joining material between an upper surface of the intermediate plate and a surface of the upper plate opposite the wafer placement surface, disposing a second metal joining material between a lower surface of the intermediate plate and an upper surface of the lower plate, and obtaining a joined body by adding heat under pressure in this state and returning temperature to room temperature.

* * * * *